(12) United States Patent
Ichikawa et al.

(10) Patent No.: US 8,980,661 B2
(45) Date of Patent: Mar. 17, 2015

(54) METHOD FOR MANUFACTURING LIGHT EMITTING DEVICE

(71) Applicant: Nichia Corporation, Anan-shi, Tokushima (JP)

(72) Inventors: Masatsugu Ichikawa, Tokushima (JP); Masahiko Sano, Anan (JP); Daisuke Sanga, Tokushima (JP); Toru Takasone, Tokushima (JP); Shunsuke Minato, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/263,695

(22) Filed: Apr. 28, 2014

(65) Prior Publication Data

US 2014/0322844 A1 Oct. 30, 2014

(30) Foreign Application Priority Data

Apr. 30, 2013 (JP) .................................. 2013-095503
Apr. 25, 2014 (JP) .................................. 2014-091179

(51) Int. Cl.
*H01L 21/00* (2006.01)
*H01L 33/50* (2010.01)
*H01L 33/00* (2010.01)

(52) U.S. Cl.
CPC .............. *H01L 33/50* (2013.01); *H01L 33/505* (2013.01); *H01L 33/0079* (2013.01); *H01L 2933/0041* (2013.01)
USPC ..................... 438/29; 438/48; 438/57; 438/96

(58) Field of Classification Search
None
See application file for complete search history.

(56) References Cited

U.S. PATENT DOCUMENTS

| 2012/0205747 A1 | 8/2012 | Yamada et al. |
| 2013/0026527 A1 | 1/2013 | Ichikawa |
| 2013/0069104 A1* | 3/2013 | Ichikawa ........................ 257/99 |

FOREIGN PATENT DOCUMENTS

| EP | 1 605 526 A2 | 12/2005 |
| JP | 2003-188171 A | 7/2003 |
| JP | 2003-318174 A | 11/2003 |
| JP | 2009-302159 A | 12/2009 |
| JP | 2010-046696 A | 3/2010 |
| JP | 2013-232499 A | 11/2013 |
| WO | WO-2011/126000 A1 | 10/2011 |
| WO | WO-2011/152262 A1 | 12/2011 |
| WO | WO-2013/002212 A1 | 1/2013 |

OTHER PUBLICATIONS

Extended European Search Report dated Sep. 26, 2014 issued in Application No. 14166133.0.

* cited by examiner

*Primary Examiner* — Kyoung Lee
(74) *Attorney, Agent, or Firm* — Foley & Lardner LLP

(57) ABSTRACT

Provided is a method for manufacturing a light emitting device comprising a light emitting element and an optical part, the method comprising the steps of (i) forming a hydroxyl film on a bonding surface of each of the light emitting element and the optical part by an atomic layer deposition, and (ii) bonding the bonding surfaces of the light emitting element and the optical part with each other, each of the bonding surfaces having the hydroxyl film formed thereon, wherein a substep is repeated at least one time in the step (i), in which substep a first raw material gas and a second raw material gas are sequentially supplied onto the bonding surfaces of the light emitting element and the optical part, and wherein the bonding of the bonding surfaces in the step (ii) is performed without a heating treatment.

14 Claims, 5 Drawing Sheets

*Fig. 2A* Hydrophilization treatment
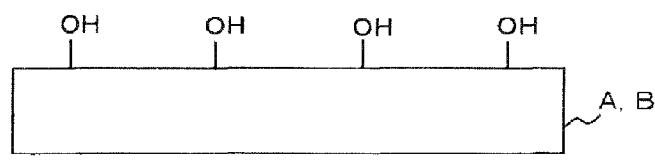
*Fig. 2B* TMA supply
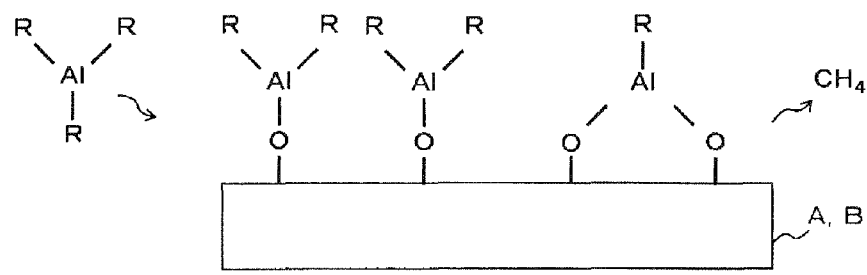
*Fig. 2C* $H_2O$ supply
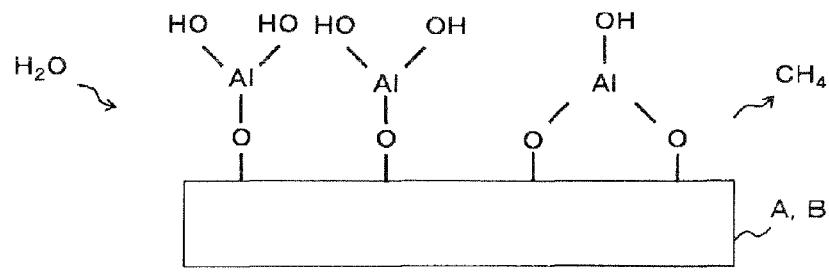

Fig. 3A Before bonding
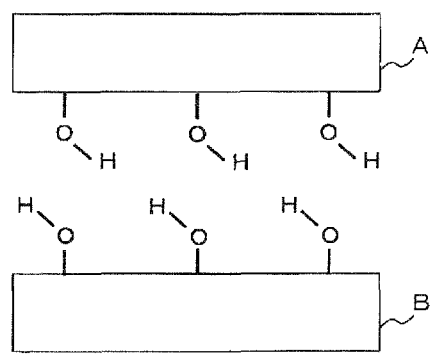
Fig. 3B At the time of contact of surfaces
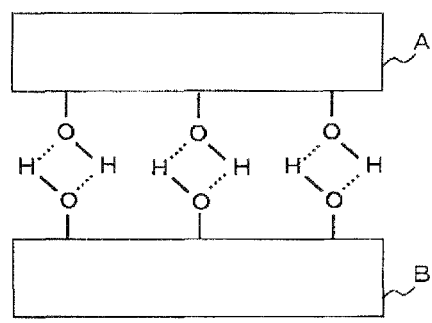
Fig. 3C Heating for desired bonding
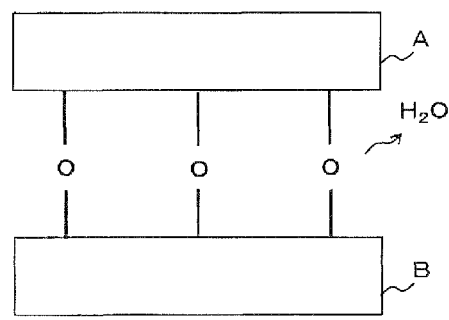

METHOD FOR MANUFACTURING LIGHT EMITTING DEVICE

CROSS-REFERENCE TO RELATED APPLICATION

This application claims priority to Japanese Patent Application No. 2013-095503 (filed on Apr. 30, 2013, the title of the invention: "METHOD FOR MANUFACTURING LIGHT EMITTING DEVICE"), the disclosure of which is incorporated herein by reference.

BACKGROUND

1. Technical Field

The present invention relates to a method for manufacturing a light emitting device comprising a light emitting element and an optical part.

2. Background Art

A light emitting diode (LED) using a nitride semiconductor has been widely known. A sapphire substrate is often used as a growth substrate for the nitride semiconductor. The nitride semiconductor and the sapphire substrate constitute alight emitting element of a light emitting device. The nitride semiconductor and the sapphire substrate are generally made of a material with a higher refractive index than that of the outside thereof. In this regard, the use of the higher-refractive-index material in the light emitting element tends to cause a light to be trapped within the light emitting element when extracting the light from the light emitting device. This is due to a decreased critical angle of a total reflection at an interface between "light emitting element composed of the nitride semiconductor and the sapphire substrate" and the outside thereof. The trapped light also tends to be reflected many times within the light emitting element while being absorbed in a metal part of the light emitting device (e.g., an electrode for the light emitting element), which leads to an attenuation of the light.

For example, the light emitting device disclosed in WO 2011/152262 (Patent Literature 1) has a decreased number of the light reflection within the light emitting element so that an improved light-extraction efficiency is provided. The disclosed light emitting device has a light-permeable substrate, which has been bonded thereto, to substantially increase the thickness of the light emitting element.

While on the other hand, there is another light emitting device having a phosphor for emitting a desired light therefrom. For example in the light emitting device disclosed in WO 2011/126000 (Patent Literature 2), "light emitting element for emitting blue light" and "phosphor for absorbing blue light and then emitting yellow light as a complementary color of the blue" are in a bonded state with each other. This light emitting device is capable of emitting a while light due to a mixing effect of the blue light from the light emitting element and the yellow light from the phosphor.

See Patent Literature 1: WO2011/152262
See Patent Literature 2: WO2011/126000
See Patent Literature 3: JP2010-46696
See Non-Patent Literature 1: Hideki Takagi, "Wafer Direct Bonding Technique", online, National Institute of Advanced Industrial Science and Technology, [Search on 31 Jan. 2013], Internet (URL:http://staff.aist.go.jp/takagi-.hideki/waferbonding.html)

SUMMARY

The inventors of the present application have found the following problems associated with "bonding of constituent elements of light emitting device" in view of the light extraction.

A resin adhesive has been conventionally used to bond an optical part (e.g., light-permeable part or phosphor) with the growth substrate of the light emitting element. However, both of a nitride semiconductor used as a semiconductor material of the light emitting element and the sapphire substrate used as the growth substrate of such semiconductor generally have a high refractive index as compared to that of the resin adhesive, which tends to bring about the total reflection of the light at an interface between the light emitting element and the resin adhesive. This can lead to a lower rate of light transmission from the light emitting element to the optical part, resulting in a decrease in the light extraction efficiency from the light emitting device.

It is conceivable to directly bond the light emitting element to the optical part without the use of any adhesives. As a direct bonding method, a surface-activated bonding method and an atomic diffusion bonding method are known. For example, the light emitting device disclosed in each of WO 2011/152262 (Patent Literature 1) and WO 2011/126000 (Patent Literature 2) described above is manufactured by the surface-activated bonding method wherein the light emitting element and the optical part are directly bonded to each other. While on the other hand, JP 2010-46696 (Patent Literature 3), for example, discloses the atomic diffusion bonding method wherein metal thin films are formed on respective smooth surfaces of two bases, and then such smooth surfaces are brought into contact with each other to cause an atomic diffusion of the metal thin films to be bonded with each other. The surface-activated bonding method and the atomic diffusion bonding method, however, require the use of an ultra-high vacuum apparatus, which leads to a lower throughput, i.e., lower productivity. This results in a higher cost in terms of a bonding apparatus. Moreover, the surface-activated bonding method has a limitation in that no bonding can be achieved with respect to a Si-based oxide (e.g., $SiO_2$). This means that the bonding of a glass material (i.e., material containing a Si-based oxide) which is generally used as material for lenses or the like is adversely restricted. While on the other hand, the atomic diffusion bonding method can bring a particular concern on an influence of the light absorption by the metal material used for the bonding, which results in a lower light-extraction efficiency.

As a direct bonding method in general, there is a hydroxyl bonding method (see Non-Patent Literature 1, for example) which has been not so far used for bonding of constituent elements of the light emitting device. The hydroxyl bonding method is considered to be not desirable in terms of cost and time since a further heating treatment, i.e., additional processing step is required for the bonding. Further, such heating treatment can cause a thermal load on the constituent elements of the light emitting device. A uniform formation of the hydroxyl groups over the bonding surface is of importance in the hydroxyl bonding method so as to achieve a desirable bonding. The hydroxyl groups in themselves can be formed for example by a plasma treatment of the bonding surface, followed by a water washing treatment thereof. However, such water washing treatment, i.e., a hydrophilization treatment, is not necessarily highly reliable, and also is difficult to quantitatively form the hydroxyl groups. Moreover, the hydroxyl bonding method can bring a certain concern in that some stain remaining on the bonding surface after the water washing treatment, which is generally called as "water mark", can adversely affect the bonding characteristics.

In view of the above-mentioned problems, the present invention has been created. That is, the present invention is mainly directed toward the provision of a manufacturing method of a light emitting device which makes it possible to achieve a suitable bonding of the constituent elements thereof.

In this regard, the inventors of the present application tried to dissolve such problems not by following up the conventional ways, but by focusing on a new way. As a result, there can be provided a manufacturing method of the present invention in which method the above problems are suitably addressed. The manufacturing method according to an embodiment of the present invention has the following features:

A method for manufacturing a light emitting device including a light emitting element and an optical part, the method comprising the steps of:

(i) forming a hydroxyl film on a bonding surface of each of the light emitting element and the optical part by an atomic layer deposition; and (ii) bonding the bonding surfaces of the light emitting element and the optical part with each other, each of the bonding surfaces having the hydroxyl film formed thereon, wherein a substep is repeated at least one time in the step (i), in which substep a first raw material gas and a second raw material gas are sequentially supplied onto the bonding surfaces of the light emitting element and the optical part, and wherein the bonding of the bonding surfaces in the step (ii) is performed without a heating treatment.

In accordance with the manufacturing method of the present invention, the hydroxyl groups can be uniformly formed on the surface of the hydroxyl film of each bonding surface due to the atomic layer deposition, which enables a more suitable bonding of the light emitting element and the optical part in the light emitting device. The manufacturing method of the present invention does not make use of a heating treatment for bonding of the light emitting element and the optical part, which particularly leads to a more simplified bonding process and no excess of the thermal load on the constituent elements of the light emitting device.

BRIEF DESCRIPTION OF THE DRAWINGS

FIGS. 1A and 1B are schematic cross-sectional views illustrating a structure of a light emitting device obtained by a manufacturing method of a light emitting device according to a preferred embodiment of the present invention, in which FIG. 1A shows a bonding structure between a light emitting element and an optical part, and FIG. 1B shows a structure of the light emitting device mounted and sealed on a mounting substrate.

FIGS. 2A, 2B and 2C are schematic illustrations for explaining the principle on a hydroxyl group formation of an ALD process, in which FIG. 2A shows the state produced after a hydrophilization treatment, FIG. 2B shows the state produced after a supply of TMA, and FIG. 2C shows the state produced after a supply of water vapor.

FIGS. 3A, 3B and 3C are schematic illustrations for explaining the principle on a general "hydroxyl bonding method", in which FIG. 3A shows the state before bonding, FIG. 3B shows the state at the time of contact of surfaces, and FIG. 3C shows the state after a heat treatment for a desired bonding.

DETAILED DESCRIPTION OF THE EMBODIMENTS

Figure 1A:
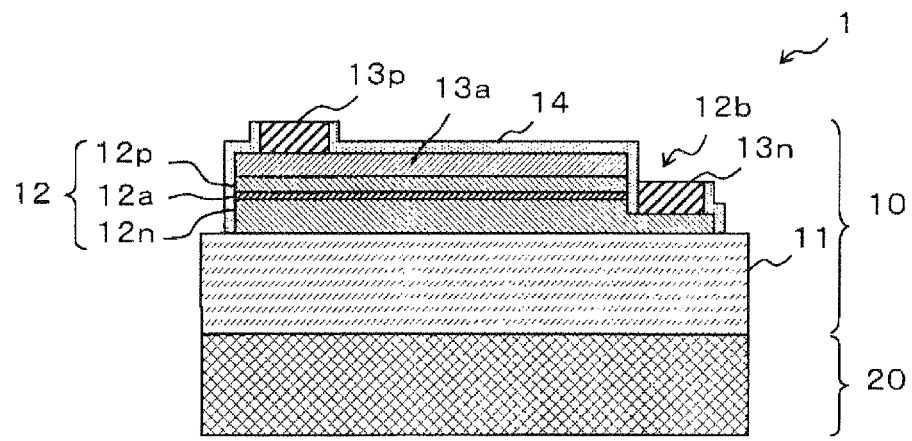

A method for manufacturing a light emitting device according to one embodiment of the present invention will be described with reference to the accompanying drawings. Note that various elements and parts, which are schematically shown in the drawings, are intended for an easy understanding of the present invention, and thus they may be different from the actual ones. For convenience of explanation, the scale, the distance, the positional relationship and so on with respect to the elements and parts are emphasized, and also a part of them is omitted in the drawings.

[Structure of Light Emitting Device]

Figure 1B:
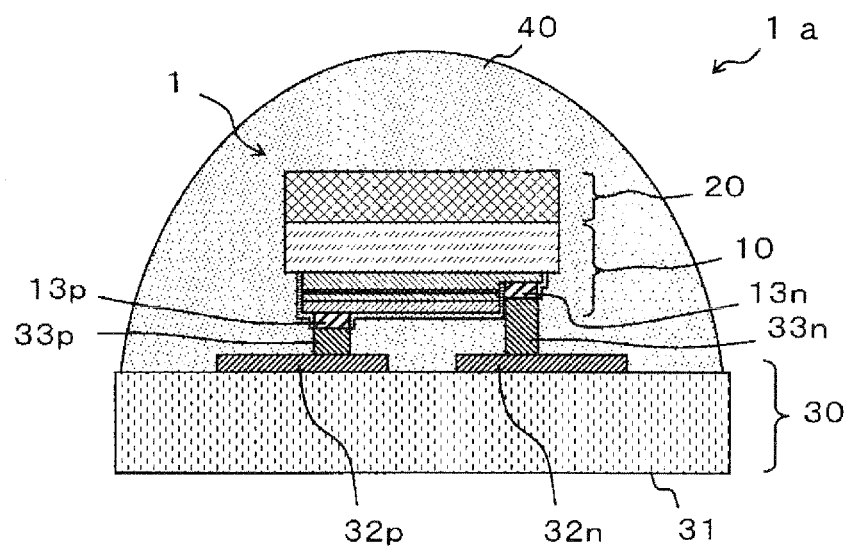

Referring to FIG. 1, a structure of a light emitting device obtained by a manufacturing method according to an embodiment of the present invention will be firstly described. As shown in FIG. 1A, the light emitting device 1 has such a structure that an light emitting element 10 and an optical part 20 are in a bonded state with each other. By way of example, a LED chip is used as the light emitting element 10, whereas a plate-shaped part with light permeability is used as the optical part 20. While on the other hand, the light emitting device 1 shown in FIG. 1B has a form of package. That is, the light emitting device, which is indicated by reference numeral "1a" in FIG. 1B, has such a package form that it has been mounted on a mounting substrate 30 and also been sealed by a sealing part 40.

The light emitting element 10 comprises a semiconductor lamination 12 and a growth substrate 11 (note that the light emitting element 10 can be called "semiconductor light emitting element" since it has the semiconductor lamination). More specifically, the light emitting element 10 may be composed of "light-permeable growth substrate 11", "lamination of n-type semiconductor layer 12n, active layer 12a and p-type semiconductor layer 12p", "p-side electrode 13p and n-side electrode 13n serving as positive and negative pad electrodes", "reflective full-face electrode 13a for diffusing an electric current from the p-side electrode 13p to the entire surface of the p-type semiconductor layer 12p", and "light-permeable protective film 14". The growth substrate 11 is a substrate for a growth of a semiconductor film. For example, the growth substrate 11 may be a sapphire substrate. As can been seen, the semiconductor lamination 12 is located on one of main surfaces of the growth substrate 11, i.e., on an upper main surface thereof in FIG. 1A (such one of main surfaces being called "first main surface"). The semiconductor lamination 12 has a recessed portion 12b at the right end portion thereof, wherein all of respective parts of the p-type semiconductor layer 12p and the active layer 12a have been removed from above, and also a part of the n-type semiconductor layer 12n has been removed. In such recessed portion 12b, the n-side electrode 13n is in an electrical connection with the n-type semiconductor layer 12n at the bottom of the recessed portion. While on the other hand, the p-side electrode 13p is in an electrical connection with the p-type semiconductor layer 12p via the full-face electrode 13a. In the illustrated embodiment of FIG. 1A, the full-face electrode 13a serves as a reflective electrode with a high-reflectivity metal layer (e.g., Ag layer, Al layer or the like) on its lower side. As such, the light emitting element 10 is in a form of a face-down mounted LED chip with its side of the growth substrate 11 serving as a light extraction surface.

In the light emitting device 1 as shown in FIG. 1A, "light-permeable plate-shaped part" serving as the optical part 20 is in a connection with the other of main surfaces of the growth substrate 11, i.e., with a lower main surface thereof in FIG. 1A (such other of main surfaces being called "second main surface").

The optical part 20 may be a flat plate-shaped part made of sapphire, for example. Such optical part 20 serves to increase the thickness of a light transmission layer of the light emitting element 10 due to a direct bonding of the part 20 with respect to the second surface of the growth substrate 11 which is also made of sapphire. The above increased thickness can decrease the number of the light reflection which is recognized as a multiple reflection within the light emitting element 10, which leads to a suppression of the trapping and absorption of the light in the light emitting device. It is preferred that the optical part 20 has the same or like refractive index as that of the growth substrate 11 serving as a bonding part of the light emitting element 10. However, the optical part 20 is not necessarily limited to this. As shown in FIG. 1B, in a case where the light emitting device 1 is in a sealed form by the seal part 40, in which case a difference in refractive index between the optical part 20 and the growth substrate 11 in the light emitting element 10 is smaller than that between the seal part 40 and the growth substrate 11, a critical angle of the total reflection is increased, and thereby a light attenuation attributed to the light trapping can be suppressed.

The shape of the optical part 20 is not limited to the flat plate shape. The optical part 20 may have, for example "convex lens-like shape", "concave-convex shape" or the like. With respect to the concave-convex shape, a part or whole of the surface other than a bonding surface region (preferably a surface region positioned opposite to the bonding surface region) has the concave-convex shape to improve the light-extraction efficiency.

Further, the optical part 20 is not limited to one having the structure for improving the light-extraction efficiency. The optical part 20 may also be a phosphor part, i.e., a wavelength-conversion part which contains a phosphor material capable of absorbing a part or all of the light (e.g., blue light) emitted from the light emitting element 10, and then emitting the light having another wavelength (e.g., yellow light). Examples of suitable phosphor materials may include a YAG (yttrium aluminum garnet) phosphor to be used for a white light-emitting LED. The YAG has a refractive index which is close to that of the sapphire. In the light emitting device having the YAG phosphor part directly connected to the light emitting element 10, the total reflection at an interface between the LED die (i.e., light emitting element 10) and the phosphor part (i.e., optical part 20) is reduced, and thereby the light transmission at such interface can be improved.

The elements or parts to be bonded by the present invention are not limited to those made of sapphire. The present invention may be available for the bondings between any elements and parts made of various materials in the light emitting device, such as the bonding between sapphire material and glass-based material, the bonding between glass-based materials, the bonding between sapphire material and SiN material, the bonding between sapphire material and SiON material, the bonding between GaN-based materials, and the bonding between GaN-based material and an oxide crystal material having a high refractive index (e.g., $SrTiO_3$). Furthermore, the bonding regarding the semiconductor material is not limited to that of the GaN-based material part, but may be the other bondings regarding the element (s) or part (s) made of compound semiconductor materials or Si-based semiconductor materials.

A part of the light emitting element 10, which is to be bonded to the optical part 20, is not limited to the growth substrate 11. For example, such part of the light emitting element 10, which is to be bonded to the optical part 20, may be the semiconductor lamination 12. The detail on this will be described. First, the semiconductor lamination 12 is formed using a GaN-based semiconductor material (i.e., semiconductor material) over the first main surface of the growth substrate 11 made of sapphire. Then, the growth substrate 11 is peeled off by a laser-lift-off process or the like, and the resulting exposed semiconductor lamination 12 is planarized. Thereafter, the optical part 20 is bonded to the exposed semiconductor lamination. In this case, when a GaN-based material is used for the optical part 20, a difference in refractive index between the semiconductor lamination 12 and the growth substrate 11 can be substantially excluded. As a result, there can be obtained a thick light emitting element with a small difference in a refractive index between the semiconductor lamination and the growth substrate, which can lead to a further improvement of the light-extraction efficiency from the interior of the device to the outside thereof.

[Manufacturing Method of Present Invention]

The method for manufacturing a light emitting device according to an embodiment of the present invention will be described. The present invention provides a method for manufacturing a light emitting device comprising a light emitting element and an optical part, the method comprising the steps of:

(i) forming a hydroxyl film on a bonding surface of each of the light emitting element and the optical part by an atomic layer deposition; and (ii) bonding the bonding surfaces of the light emitting element and the optical part with each other, each of the bonding surfaces having the hydroxyl film formed thereon.

The light emitting element may be, for example a semiconductor lamination, as described above. The light emitting element may also be a semiconductor lamination equipped with a growth substrate (e.g., sapphire substrate). In a case where the light emitting element is the semiconductor lamination equipped with the growth substrate (e.g., sapphire substrate), a surface of the growth substrate preferably corresponds to the bonding surface of the light emitting element.

As described above, the optical part may be, for example a flat plate-shaped part, a convex lens-shaped part, or a concave-convex-shaped part, all of which have a light permeability. By way of example, the optical part may be the flat plate-shaped part made of sapphire. The optical part may also be a wavelength-conversion part for converting a light emitted from the light emitting element into a light having a different wavelength from that of the light emitting element. By way of example, the wavelength-conversion part may be a phosphor plate which contains a phosphor material capable of absorbing a part or all of the blue light emitted from the light emitting element 10, and then emitting the yellow light having another wavelength therefrom.

In accordance with the manufacturing method according to an embodiment of the present invention, the step (i) is firstly performed. That is, the hydroxyl film is formed on the bonding surface of each of the light emitting element and the optical part by performing the atomic layer deposition. The atomic layer deposition can be abbreviated as "ALD", in which a reaction process of film forming is completed for each of one atomic layer or one molecule layer, and such reaction process is repeated until a desired film is formed. The present invention suitably makes use of the ALD to form the hydroxyl film on the bonding surface of the light emitting element and the bonding surface of the optical part.

In the step (i), a substep is repeated at least one time, in which substep at least a first raw material gas and a second raw material gas are sequentially supplied onto the bonding surfaces of the light emitting element and the optical part, and thereby the hydroxyl film (i.e., a film with hydroxyl group at its termination) is formed. In other words, the completion of the film-forming process is done at a point in time when the film formed on each of the bonding surfaces comes to have a desired state of the hydroxyl groups located at the termination of the film.

As the first raw material gas, a gas having a reactivity with respect to a hydroxyl group having been preliminarily introduced on the bonding surfaces is preferably used. In other words, it is preferred that the first raw material gas may be a gas having the reactivity with respect to the hydroxyl group which has been preliminarily introduced on the bonding surface prior to the ALD process. For example, at least one selected from the group consisting of TMA (trimethylaluminium), TEOS (tetraethoxysilane), TDMAS (tris(dimethylamino)silane), TEMAH (tetrakis(ethylmethylamino)hafnium), TEMAZ (tetrakis(ethylmethylamino)zirconium) and TDMAT (tetrakis(dimethylamino)titanium) is used in a gaseous state as the first raw material gas.

While on the other hand, a gas having a substitutional reactivity with respect to a functional group of the first raw material gas having reacted with the hydroxyl group of the bonding surfaces is preferably used as the second raw material gas. In other words, it is preferred that the second raw material gas is a gas capable of causing a substitutional reaction with respect to the functional group contained in the first raw material gas which has been beforehand supplied to the bonding surface and thus reacted with the hydroxyl group of the bonding surface. For example, the second raw material gas may be a gas having a substitutional reactivity with respect to hydrogen, alkyl group, alkenyl group, alkynyl group, aryl group or the like of the first raw material gas having reacted with the hydroxyl group of the bonding surface. According to a preferred one embodiment of the present invention, the second raw material gas may be a gas having a substitutional reactivity with respect to the alkyl group (e.g., methyl group) of the first raw material gas having reacted with the hydroxyl group of the bonding surface. In this case, the alkyl group contained in the first raw material gas having reacted with the hydroxyl group of the bonding surfaces is substituted by an atom group of the second raw material gas. In a case where the TMA is used in a gaseous state as the first raw material gas, and also the water is used in a gaseous state as the second raw material gas, a reaction occurs such that the methyl group of the TMA having reacted with the hydroxyl group of the bonding surfaces is substituted by a hydroxyl group of the water.

As the second raw material gas, not only the water vapor, but also other gases such as a hydrogen peroxide ($H_2O_2$) and an ozone ($O_3$) may be used. In other words, at least one selected from the group consisting of water, hydrogen peroxide and ozone may be used in a gaseous state as the second raw material gas. Moreover, oxygen ($O_2$) or ammonia ($NH_3$) may also be used as the second raw material gas.

The term "hydroxyl film" as used herein means a film with hydroxyl group at its termination. That is, the hydroxyl film substantially corresponds to a film having hydroxyl groups at an uppermost surface or exposed surface thereof. In view of a preferred concrete embodiment of the present invention, the hydroxyl film can be a film with hydroxyl groups therein, capable of providing a bonding effect attributed to an interaction between two of such films when being brought close to each other.

Prior to the atomic layer deposition (ALD) of step (i), a hydrophilization treatment is preferably performed to in advance form a hydroxyl group on the bonding surfaces of the light emitting element and the optical part. When the first raw material gas is supplied onto the bonding surfaces, then the first raw material gas reacts with the hydroxyl group formed on the bonding surfaces, and thereby a hydroxyl film precursor is formed. The hydroxyl film precursor corresponds to a precursor for a formation of the hydroxyl film.

As the hydrophilization treatment performed prior to the ALD of the step (i), it is preferred that at least one of the bonding surfaces of the light emitting element and the optical part is subjected to a plasma treatment, followed by being exposed to a water. This can suitably provide a preliminary formation of the hydroxyl group on the at least one of the bonding surfaces of the light emitting element and the optical part. It is particularly preferred that both of the bonding surfaces of the light emitting element and the optical part are subjected to the plasma treatment, followed by being exposed to the water to preliminarily form the hydroxyl group on both of the bonding surfaces of the light emitting element and the optical part.

Prior to the step (i), at least one of the bonding surfaces of the light emitting element and the optical part may be subjected to a planarizing treatment. The planarizing treatment makes it possible to achieve a more suitable bonding. It is preferred that both of the bonding surfaces of the light emitting element and the optical part are subjected to the planarizing treatment. The planarizing treatment is particularly preferably performed such that an arithmetic average roughness Ra regarding each of the bonding surfaces of the light emitting element and the optical part is 1 nm or less. The term "arithmetic average roughness Ra" as used herein means a surface roughness defined by JIS B0601-2001.

The planarizing treatment is preferably performed prior to the above hydrophilization treatment. For example, it is preferred that the planarizing treatment is performed, and thereafter at least one of the bonding surfaces of the light emitting element and the optical part is subjected to the plasma treatment, followed by being exposed to the water. This makes it possible to in advance form the hydroxyl group on the planarized surface, which leads to an achievement of a more suitable bonding.

The sequential processes associated with the step (i) will be described in more detail. First, the first raw material gas is supplied onto the respective ones of the bonding surfaces of the light emitting element and the optical part. As a result of this, the first raw material gas is allowed to react with the hydroxyl group which has been preliminarily formed on the bonding surfaces by the hydrophilization treatment. Specifically, a reaction occurs such that a hydrogen atom of the hydroxyl group is substituted by a functional group of the supplied first raw material gas to produce the hydroxyl film precursor. Subsequent to the supply of the first raw material gas, the second raw material gas is supplied onto the respective ones of the bonding surfaces of the light emitting element and the optical part. As a result of this, a functional group of the first raw material gas having reacted with the hydroxyl group of the bonding surfaces is substituted by the atom group of the second raw material gas to form the hydroxyl film. The hydroxyl groups of the resulting hydroxyl film become more uniformly distributed than the preliminary hydroxyl group formed by the hydrophilization treatment, which leads to a suitable performing of the subsequent bonding step (ii). In other words, a preferred embodiment of the present invention makes it possible to suitably perform the bonding step (ii) without a heating treatment due to the fact that the bonding surfaces respectively have the uniformly distributed hydroxyl groups thereon.

The first raw material gas may be supplied again after the supply of the second raw material gas, and thereby the hydroxyl film precursor can be formed again. In this case, when the second raw material gas is again supplied, there can be similarly obtained the hydroxyl film, i.e., the film with hydroxyl group at its termination. Such repeated supply of the first and second raw material gases can further improve the uniformity of the hydroxyl groups of the hydroxyl film (i.e., the homogeneity of the hydroxyl groups formed on the bonding surfaces).

The substep may be performed at least one time wherein the first and second raw material gases are sequentially supplied onto the bonding surfaces to form the hydroxyl film on the bonding surface. In this case, such formation of the hydroxyl film is preferably performed such that the film has the thickness of 1 to 5 nm. Namely, it is preferred that the film with its thickness of 1 to 5 nm is formed as the hydroxyl film in the step (i). This makes it possible to more suitably perform the bonding step (ii).

The detail on the hydroxyl group formation of the ALD will now be described. The inventors of the present application have found that the uniform formation of the hydroxyl groups over the bonding surface is of importance to achieve a desired bonding in the subsequent step (ii). In other words, the inventors of the present application, after their extensive study, have found that the ALD can be suitably utilized so as to form the hydroxyl groups more uniformly in the step (i).

The ALD is known as a process for forming a metal oxide film or a metal nitride film on a scale of atomic layer (see JP2003-188171 and JP2007-274002, for example). In the ALD process, two or more kinds of precursors used as raw material gases are alternately supplied onto a surface, whereby a surface adsorption and a surface reaction of the raw material gases, which are regarded as elementary steps of CVD (chemical vapor deposition), can be controlled on a scale of single atomic layer so as to achieve a growth of each film layer, which can lead to an formation of a more dense thin film with a more uniform thickness.

Now, the principle of the formation of the hydroxyl groups using the ALD process will be more specifically described with reference to FIGS. 2A to 2C. In the illustrated embodiments of FIGS. 2A to 2C, the hydroxyl groups are formed on the uppermost surface of the film by making use of a forming process of $Al_2O_3$ film. In the forming process of the hydroxyl groups, trimethylaluminium (TMA; $Al(CH_3)_3$) and water ($H_2O$) are used in their gaseous states, and alternately supplied to the bonding surfaces as the raw material gases.

The bonding surfaces of the light emitting element and the optical part are respectively modeled as the bonding surfaces of "Part A" and "Part B", such bonding surfaces being upper faces of respective ones of the Parts A and B in FIGS. 2A to 2C. First, the bonding surfaces of the Parts A and B to be bonded with each other are subjected to the hydrophilization treatment to form the hydroxyl groups on the bonding surface as an initial state, as shown in FIG. 2A. As the hydrophilization treatment, a plasma treatment may be performed with respect to the respective bonding surfaces of the Parts A and B, followed by being exposed to a water by a dipping process or a spraying process. As mentioned above, the hydroxyl groups are not necessarily formed uniformly at this stage. In this regard, an embodiment of the present invention makes it possible to resolve the non-uniformity of the hydroxyl groups (e.g., the non-uniformity attributed to the water mark) of the initial state. Alternatively, a water may be firstly supplied (without performing the plasma treatment) to form the hydroxyl groups on the bonding surfaces.

Next, as shown in FIG. 2B, the TMA is supplied in a gaseous state as the first raw material gas onto the Parts A and B. The supplied TMA is allowed to chemically react with the hydroxyl groups formed on the surfaces of the Parts A and B. Specifically, the reaction of TMA proceeds such that the TMA is chemically adsorbed to the hydroxyl groups formed on the surfaces of the Parts A and B. More specifically, one or two methyl group(s) bonded to a Al atom of the TMA is/are released, whereby the Al atom of the TMA becomes to be bonded to an O atom of the hydroxyl group while a hydrogen atom is released from the hydroxyl group. The released methyl group from the TMA is bonded to the released hydrogen atom from the hydroxyl group to form a methane as a by-product. As a result, the film surface (i.e., uppermost surface of the film) has the methyl groups at its termination. The excessive TMA and methane as the by-product are exhausted, for example by using of a flow of a nitrogen gas.

Subsequent to the supply of the first raw material gas, the water is supplied in a gaseous state as the second raw material gas onto the surfaces of the Parts A and B. As shown in FIG. 2C, the supplied water is allowed to react with a terminal functional group of the film surface. Specifically, the methyl group is allowed to leave the Al atom on the surfaces, and thereby the Al atom becomes to be bonded to a hydroxyl group of the water, while the methyl group left from the Al atom is bonded to a hydrogen atom from the water to form a methane as a by-product. As a result, the film surface has the hydroxyl groups at its termination. That is, the hydroxyl film is suitably formed on the bonding surfaces. The excessive water and methane as the by-product are exhausted, for example by using of a flow of a nitrogen gas. After such exhaustion, the TMA are again supplied as the next raw material gas.

In the process where the TMA and the water are alternately supplied to form the film, the Al atom on the uppermost surface becomes to have the hydroxyl group at the termination of the film after the water is supplied to complete the surface reaction. As such, the formation of the hydroxyl group is performed under self-organization such that the resulting hydroxyl groups are more uniformly distributed. The self-organization and the more uniform distribution of the hydroxyl groups can be confirmed by a higher uniformity in thickness of the formed film.

The present invention makes a suitable use of the ALD process as a forming process of the hydroxyl film in view of the fact that the hydroxyl groups can be uniformly formed on the uppermost surface of the formed film during the forming process of the ALD. That is, the non-uniformed formation of the hydroxyl groups at the initial state (which may be provided after the hydrophilization treatment consisting of the plasma treatment and the subsequent water washing treatment) can be resolved by the ALD to provide an improved uniformity of the hydroxyl groups on the bonding surfaces. This improved uniformity of the hydroxyl groups on the bonding surfaces enables the bonding step (ii) to be suitably performed. Namely, due to the improved uniformity of the hydroxyl groups, a desired bonding step (ii) can be performed even when no heating treatment is performed upon such bonding step (ii).

Materials for the film formation of the ALD can be appropriately selected depending on kinds of the hydroxyl film. It is preferred in this regard that the formed film at least has a light permeability with respect to a light having a wavelength at which the light emitting element 10 emits the light, and also has the same or near refractive index as that of the material of the bonding portion of the light emitting element 10 and that of the material of the optical part 20. Such film makes it possible to reduce the total reflection at the interface between the light emitting element 10 and the optical part 20, allowing the light to pass through the interface without loss, which leads to a significant suppression of an optical influence of the film formed by the ALD.

For example, $Al_2O_3$ exemplified in this embodiment of the present invention has substantially the same refractive index as that of the sapphire substrate used for a LED of a general GaN-based semiconductor. Therefore, when the $Al_2O_3$ film formed on the bonding surface of the sapphire substrate is bonded to the optical part 20, the optical influence of the film formed by the ALD can be significantly suppressed. In a case where the optical part 20 to be bonded is a phosphor plate, the $Al_2O_3$ material has the similar refractive index to that of a YAG phosphor used for a white light-emitting LED. Thus, the $Al_2O_3$ material and the YAG phosphor can be considered to be a preferable combination.

With respect to the ALD, it is preferred that the film formation is performed under a heating condition with a high temperature of 100° C. or higher. The film formation process of the ALD may be enough to be carried out for at least one cycle, but may also be repeatedly carried out for about two cycles to several tens of cycles to form a desired film with its thickness of about 1 to 5 nm, and preferably 2 to 3 nm. The thickness of 1 nm or more regarding the film formed by the ADL can suitably resolve the non-uniformity of the original hydroxyl groups on the bonding surfaces (such non-uniformity being attributed to the influence of stains or the like). While on the other hand, the thickness of 5 nm or less regarding the film formed by the ADL cannot cause an excessive increase in a surface roughness attributed to an expansion of fine concave-convex portions on the bonding surfaces. The above preferable heating condition and film thickness make it possible to achieve a more stable bonding.

During the film forming cycle of the ALD, the raw material gases are supplied, and thereby the hydroxyl groups are formed at a point in time when the reaction associated with such raw material gases is completed. That is, the film forming cycle ends with the formed film with the hydroxyl groups at its termination. Examples of the combinations of such raw material gases may include, in addition to a combination of the TMA and the water for forming the $Al_2O_3$ film as described above, a combination of tetraethoxysilane (TEOS) and water for forming $SiO_2$ film, a combination of tris(dimethylamino)silane (TDMAS) and water for forming $SiO_2$ film, a combination of tetrakis(dimethylamino)titanium (TDMAT) and water for forming $TiO_2$ film, a combination of tetrakis(ethylmethylamino)hafnium (TEMAH) and water for forming $HfO_2$ film, and a combination of tetrakis(ethylmethylamino)zirconium (TEMAZ) and water for forming $ZiO_2$ film. Additionally, as the first raw material gas, an organic metal or halogenated metal containing Al, Si, Ti, Zr, Hf, Zn, La, Y, Ba, Sr, Ta, Nb, Sn, In, and/or the like can also be used in a gaseous state. Further, as the second raw material gas hydrogen peroxide ($H_2O_2$), ozone ($O_3$), oxygen ($O_2$) or ammonia ($NH_3$) can also be used as a gaseous state, instead of the water vapor.

Subsequent to the step (i), the step (ii) is performed. That is, the bonding surfaces of the light emitting element and the optical part are bonded to each other, each of the bonding surfaces having the hydroxyl film formed thereon. According to an embodiment of the present invention, the bonding step (ii) is performed without a heating treatment.

While the bonding step (ii) is considered as belonging in the same equation as a so-called "hydroxyl bonding method" in view of the bonding between the hydroxyl film-formed surfaces (i.e., bonding surfaces of the light emitting element and the optical part, each of the bonding surfaces having the hydroxyl film formed thereon), the bonding step (ii) according to the present invention does not involve the heating treatment. This means that no heating treatment is performed with respect to the bonding surfaces, not only upon the bonding step, but also after the bonding step. Note that an embodiment of the present invention provides a desired bonding characteristics in spite of no heating treatment while a general "hydroxyl bonding method" provides a desired bonding by the heating treatment (wherein the bonding surfaces are brought into contact with each other, and thereafter they are heated). As such, the bonding step according to an embodiment of the present invention does not require the heating treatment, which is attributable to the uniformly formed hydroxyl groups on the bonding surfaces in the step (i).

Now, the principle of a general "hydroxyl bonding method" will be elaborated with reference to FIGS. 3A to 3C. As shown in FIGS. 3A and 3B, when the Parts A and B having the hydroxyl groups formed thereon are brought into contact with each other, a hydrogen bond is formed between the respective hydroxyl groups of the two surfaces of the Parts A and B. The hydrogen bond brings about a bonding between the Parts A and B. In this regard, the general "hydroxyl bonding method" requires the heating treatment performed at a temperature of about 200 to 1000° C. to cause the hydrogen-bonded hydroxyl groups to be dehydrated for a desired bonding between the Parts A and B (see FIG. 3C). In some cases, the heating at a high temperature of 1000° C. or higher may be required, depending on the materials of the Parts A and B. For example in a case where the Parts A and B are both made of Si, the heating at high temperature of 1000° C. or higher enables a Si—Si bond to be formed between the Parts A and B.

In accordance with an embodiment of the present invention, the hydroxyl groups of the film are more uniformly formed over the respective ones of the two bonding surfaces in the step (i), and thereby a desired bonding can be provided when bringing the hydroxyl film-formed surfaces into contact with each other in the step (ii).

Preferably, a room-temperature contact treatment is performed wherein the bonding surfaces of the light emitting element and the optical part are brought into contact with each other under a room temperature condition. The term "room temperature" as used herein substantially means a temperature of 10 to 40° C., preferably a temperature of 15 to 25° C. It is preferred in the room-temperature contact treatment that, prior to the step (ii) (i.e., at a point in time between steps (i) and (ii)), the light emitting element and the optical part are cooled down to a room temperature. This cooling down of the light emitting element and the optical part may be performed as a natural cooling or a forced cooling by a suitable cooling means (e.g., cooler).

Preferred Concrete Embodiment of Present Invention

Figure 4:
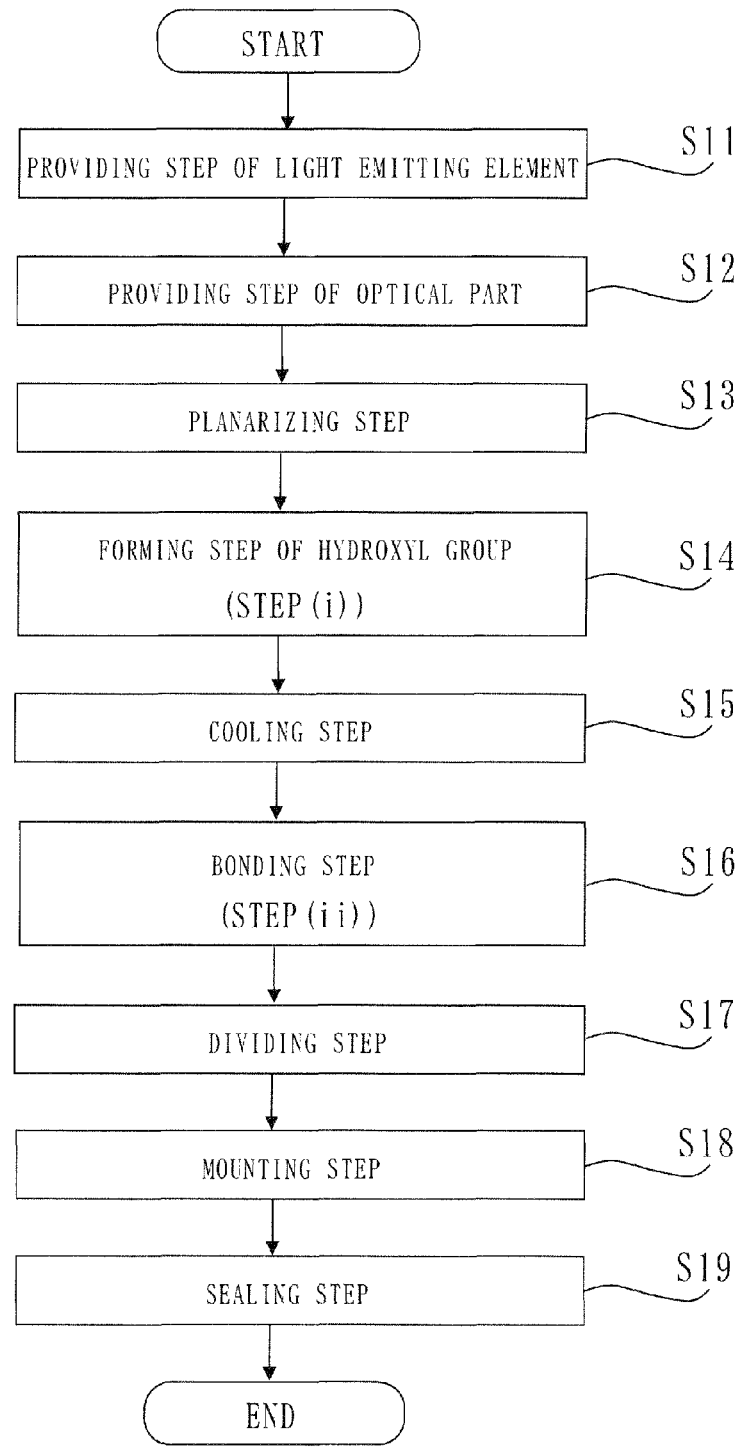
FIG. 4 is a flowchart on a manufacturing method of a light emitting device according to a preferred concrete embodiment of the present invention.

With reference to FIG. 4, the manufacturing method of the light emitting device according to a preferred concrete embodiment of the present invention will now be described. By way of example, the light emitting device 1a having such a configuration as shown in FIG. 1B (wherein a nitride semiconductor is used as the semiconductor material) is manufactured in accordance with the preferred concrete embodiment.

In the manufacturing method of the light emitting device according to the preferred concrete embodiment of the present invention, "providing step S11 of light emitting element", "providing step S12 of optical part", "planarizing step S13", "forming step S14 of hydroxyl group", "cooling step S15", "bonding step S16", "dividing step S17", "mounting step S18" and "sealing step S19" are sequentially performed, as shown in FIG. 4.

(Providing Step of Light Emitting Element)

The providing step S11 of light emitting element is a step for preparing or fabricating the light emitting element 10 with its singulated form. Namely, the step S11 is a step for producing the light emitting element 10 having such a structure as shown in FIG. 1A.

Specifically, the n-type semiconductor layer 12n, the active layer 12a, and the p-type semiconductor layer 12p are firstly stacked over the growth substrate 11 made of sapphire or the like in that order to form the semiconductor lamination 12. The structures of the n-type semiconductor layer 12n, the active layer 12a and the p-type semiconductor layer 12p can be made of, but not limited to, suitable materials for semiconductor light emitting element, such as GaN, GaAs, InGaN, AlInGaP, GaP, SiC, and ZnO. As for a nitride-based semiconductor material, a GaN-based compound semiconductor represented by the following general formula can be preferably used:

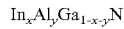

$In_xAl_yGa_{1-x-y}N$ wherein $0 \leq X$, $0 \leq Y$ and $X+Y \leq 1$.

After the formation of the semiconductor lamination 12, an etching process is performed in some region corresponding to a part of the upper surface of the semiconductor lamination 12. Specifically, parts of the p-type semiconductor layer 12p, active layer 12a and n-type semiconductor layer 12n are removed by the etching process, and thereby the recessed portion 12b with the n-type semiconductor layer 12n exposed at its bottom is formed. Upon the etching process, division regions (not shown) for partitioning a wafer into the individual ones of the light emitting elements 10 may also be removed wherein some parts of the semiconductor lamination 12 are etched away. Similarly to the case of the recessed portion 12b, the removal of the division region may be performed such that a part of the n-type semiconductor layer 12n is removed, or all the n-type semiconductor layer 12 is removed, thereby exposing the growth substrate 11.

Then, the n-side electrode 13n is formed as the pad electrode at the bottom of the recessed portion 12b. In a light emitting region composed of the p-type semiconductor layer 12p and the active layer 12a, the full-face electrode 13a covering substantially the entire upper surface of the p-type semiconductor layer 12p is formed. The p-side electrode 13p is formed as the pad electrode over a part of the upper surface of the full-face electrode 13a. The protective film 14 (e.g., insulating $SiO_2$ film) is formed over the entire surface of the wafer, for example by a sputtering process.

Through the above processes, there can be provided the light emitting elements 10 having the form of wafer.

Then, the light emitting element 10 in the form of wafer is divided along the division regions, for example by a dicing process, a scribe process or the like. As a result, some LED chips, each of which has the singulated light emitting element 10, are produced. Before the dividing of the wafer, the backside of the growth substrate 11 may be polished to make the substrate (i.e., wafer) thinner. The thinner wafer is easy to be divided. The polishing for the thinning treatment may be performed as the planarizing step S13 of the light emitting element 10.

The singulated light emitting elements 10 are arranged bidimensionally over a plate-shaped jig substrate (not shown) with an adhesive sheet attached to its surface. Specifically, the light emitting elements 10 are arranged over the jig substrate with the second main surface of the growth substrate 11 of each element facing upward, the second main surface corresponding to the bonding surface of the light emitting element to be bonded with the optical part 20.

(Providing Step of Optical Part)

The providing step S12 of optical part is a step for preparing or fabricating the optical part 20. In a case where the optical part 20 is a plate-shaped part made of sapphire, the same substrate as the growth substrate 11 as used in the providing step S11 of light emitting element may be utilized. Alternatively, a sapphire substrate in the form of wafer with a different thickness or size from the growth substrate 11 may also be utilized as the plate-shaped part. Further, the backside of the sapphire substrate in the form of wafer may be polished so that the sapphire substrate has a desired thickness.

With respect to "providing step S11 of light emitting element" and "providing step S12 of optical part", either one of the two may be performed prior to the other. Alternatively, the providing step S11 of light emitting element and the providing step S12 of optical part may be performed concurrently with each other.

(Planarizing Step)

The planarizing step S13 is a step for planarizing the bonding surface of the light emitting element 10 which is provided from the step S11, and also the bonding surface of the optical part 20 which is provided from the step S12. The planarizing step S13 enables the bonding surfaces to have a desired surface roughness.

The surface roughness of the bonding surfaces is more or less of importance in the step (ii) of the manufacturing method of the present invention so as to achieve the better bonding. In this regard, the planarizing treatment is preferably performed such that an arithmetic average roughness Ra (JIS B0601-2001) regarding each of the bonding surfaces of the light emitting element and the optical part is 1 nm or less. For example, a chemical mechanical polishing (CMP) can be utilized as the planarizing so as to achieve such a higher level of smoothness of the bonding surfaces.

As for the planarization of the bonding surface of the light emitting element 10, it may be performed as a part of the providing step S11 of light emitting element. For example in a case where the second main surface of the growth substrate 11 corresponds to the bonding surface of the light emitting element 10, the planarization may also be performed as a part of polishing and thinning the growth substrate 11 or as a subsequent step thereafter, at a point in time before the dicing process of the wafer-formed light emitting element 10. Similarly, the planarization of the bonding surface of the optical part 20 may be performed as a part of the providing step S12 of optical part.

If at least one of the bonding surface of the light emitting element 10 and the bonding surface of the optical part 20 already has a sufficient smoothness, no planarizing step S13 may be performed.

(Forming Step of Hydroxyl Group)

Next, the forming step S14 of hydroxyl group is performed. That is, the step (i) is carried out. In the forming step S14, the hydroxyl groups are formed on the respective bonding surfaces of the light emitting element 10 and the optical part 20.

According to the preferred concrete embodiment of the present invention, both of the bonding surfaces of the light emitting element 10 and the optical part 20 are subjected to the ALD process to form the hydroxyl film, i.e., the film with hydroxyl group at its termination. The detail of the forming step S14 will be described later.

(Cooling Step)

Next, the cooling step S15 is performed. In the cooling step S15, the light emitting element 10 and the optical part 20, which have been under a heated atmosphere of the ALD in the forming step S14, is subjected to a cooling treatment. It is preferred that the light emitting element 10 and the optical part 20 are cooled down to a temperature that is lower than a processing temperature of the forming step S14 of hydroxyl group. It is more preferred that the light emitting element 10 and the optical part 20 are cooled down to a room temperature. The cooling step S15 may be performed by taking the light emitting element 10 and the optical part 20 out of a rector for the step S14, followed by being left to stand in a room under a room temperature so as to be cooled.

(Bonding Step)

Next, the bonding step S16 is performed. That is, the step (ii) is carried out. In this step S16, it is preferred that the light emitting element 10 and the optical part 20, which have been cooled down to the room temperature in the cooling step S15, are brought into contact with each other. Specifically, the bonding surfaces of the light emitting element 10 and the optical part 20 are opposed to each other, and then such bonding surfaces are brought into contact with each other under a condition of room temperature. As such, a room-temperature contact treatment may be performed as the bonding step S16, i.e., as the step (ii). While not wishing to be bound by any theory, the room-temperature contact treatment enables the hydrogen bonds to be suitably formed between the bonding surface of the light emitting element 10 and the bonding surface of the optical part 20, and thereby the light emitting element 10 and the optical part 20 are suitably bonded with each other. As described above, the hydroxyl film has the uniformly distributed hydroxyl groups on its surface due to the atomic layer deposition. The uniformly distributed hydroxyl groups make it possible to achieve a suitable bonding of the light emitting element 10 and the optical part 20 in spite of the hydrogen bond.

In order to achieve a more suitable contact of the bonding surfaces, the bonding surfaces of the light emitting element 10 and the optical part 20 may be brought into contact with each other under pressure. In other words, the bonding step (ii) may be performed such that a pressure bonding occurs between the light emitting element 10 and the optical part 20.

(Dividing Step)

Next, the dividing step S17 is performed. Specifically, the bonded element 10 and part 20 are divided such that the optical part 20 in the form of wafer is divided into pieces at intervals between the arranged light emitting elements 10 by a dicing process or a scribe process. As a result, there can be obtained the singulated light emitting device 1 with the light emitting element 10 and the optical part 20 bonded together.

(Mounting Step)

Next, the mounting step S18 is performed. Specifically, the singulated light emitting device 1 is face-down mounted on the mounting substrate 30. Upon the mounting, an electrical connection regarding the n-side electrode 13n of the light emitting device 1 is done via a wiring electrode 32n and a bump 33n on the mounting substrate 30, and also an electrical connection regarding the p-side electrode 13p of the light emitting device 1 is done via a wiring electrode 32p and a bump 33p on the mounting substrate 30.

(Sealing Step)

Next, the sealing step S19 is performed. Specifically, the outer periphery of the light emitting device 1 mounted on the mounting substrate 30 is sealed by the sealing part 40. The sealing part 40 can be appropriately formed of a resin material (e.g., an epoxy resin and/or a silicone resin), an inorganic material (e.g., glass) or the like, for example. Examples of the sealing process include, but not limited to, a compression molding process using a die, a transfer molding process, and the like. A potting method may also be used wherein a bank is provided at the outer edge of the mounting substrate 30, and then an adequate-viscosity material for the seal part 40 is supplied by dropping it.

The sealing part 40 preferably has a light permeability with respect to the light emitted from the light emitting device 1. The seal part 40 may additionally serve as a light diffusion part, a heat transmission part, a phosphor part for converting the light wavelength, or the like.

Through the above processes, there can be obtained the light emitting device 1a in a form of package (see FIG. 1B).

Now, the detail on the forming step S14 of hydroxyl group (i.e., the forming step of the hydroxyl film), which is performed as the step (i) of the manufacturing method of the present invention, will be described with reference to FIG. 5 (and also FIGS. 1, 3 and 4 as needed).

Figure 5:
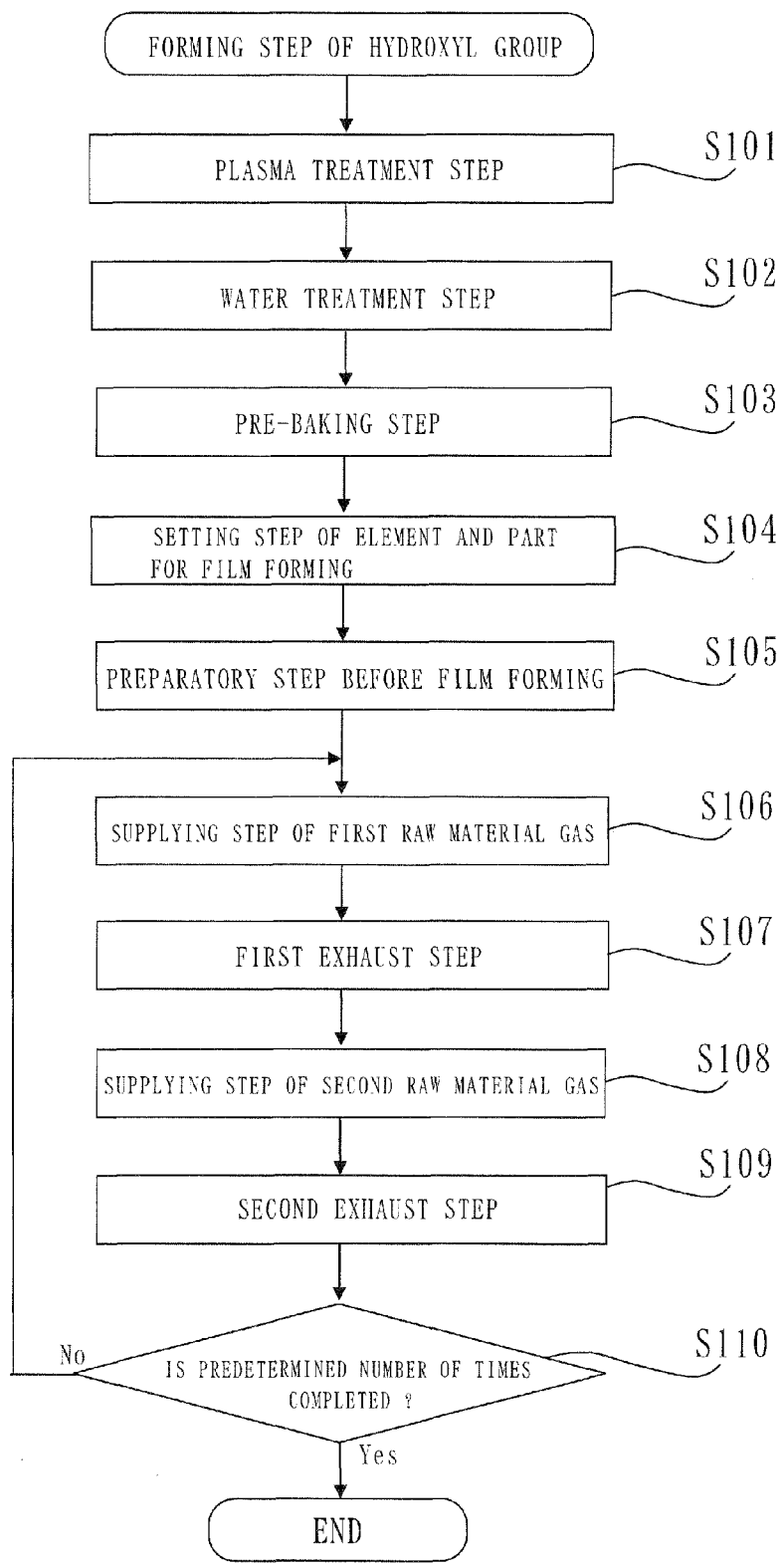
FIG. 5 is a flowchart showing a detailed flow of a hydroxyl group formation step (i.e., step (i)) in a manufacturing method of a light emitting device according to a preferred concrete embodiment of the present invention.

As shown in FIG. 5, the forming step of hydroxyl group includes "plasma treatment step S101", "water treatment step S102", "pre-baking step S103", "setting step S104 of element for film forming", "preparatory step S105 before film forming", "supplying step S106 of first raw material gas", "first exhaust step S107", "supplying step S108 of second raw material gas" and "second exhaust step S109". The sequential processes from the supplying step S106 of first raw material gas to the second exhaust step S109 are repeatedly performed a predetermined number of times.

(Plasma Treatment Step)

In the forming step of hydroxyl group, the plasma treatment step S101 is firstly performed. Specifically, the bonding surface of the optical part 20, and also the second main surface of the growth substrate 11, which corresponds to the bonding surface of the light emitting element 10, are subjected to the plasma treatment. A source for plasma of the plasma treatment may be an argon plasma, an oxygen plasma and/or a nitrogen plasma. The plasma treatment makes it possible to not only remove stains (e.g., an oil films) attached to the bonding surfaces, or another unnecessary elements, but also modify the bonding surface so that the hydroxyl group is easily formed on the bonding surface by the subsequent water treatment in which the bonding surface is brought into contact with the water.

The temperature of the growth substrate 11 and optical part 20 at the time of the plasma treatment may be appropriately decided according to the materials thereof. An excessively lower temperature can cause the residual hydroxyl group to remain in the superficial layer of the film. Therefore, for example in a case where the substrate or part to be subjected to the plasma treatment is made of $Al_2O_3$, the temperature of the plasma treatment is preferably in the range of 80 to 250° C., and more preferably about 180° C.

In a case where the light emitting device in the form of package is produced by mounting the light emitting element 10 on the package using a resin material, followed by bonding the optical part 20 thereto, the resin material for the package and also the heat resistance of a sheet used for arranging the packages are preferably taken into consideration. In this case, the temperature of the plasma treatment is preferably a lower temperature, for example about 100° C. Moreover, in a case where Ag is used as reflective materials for the light emitting element 10, the temperature of the plasma treatment is preferably about 100° C. so that an aggregation of Ag atoms, which is attributed to the heat, may be suppressed.

(Water Treatment Step)

Next, the water treatment step S102 is performed. Specifically, the bonding surface, which has undergone the plasma treatment, is subjected to a water washing treatment by a dipping process, a spraying process or the like. In other words, the hydrophilization treatment is performed wherein the boding surface is exposed to a water. The water treatment step makes it possible to provide the initial state for the film forming of the ALD, in which state the hydroxyl groups are formed on the bonding surface.

No water treatment step S102 may be possible. In this case, the second raw material gas, which may be water in a gaseous state, is firstly supplied to the bonding surface so as to form the hydroxyl groups thereon.

(Pre-Baking Step)

Then, the pre-baking step S103 is performed. Specifically, the bonding surface of the light emitting element 10 and the bonding surface of the optical part 20 are heated by using of an oven. In a case where the TMA is used as the first raw material gas and the water vapor is used as the second raw material gas to form the hydroxyl film, no excess water content is preferred. In order to achieve the better formation of the film, it is preferred that excessive moisture adsorbed to the bonding surface at a point in time before the film formation is removed as much as possible by evaporation.

The pre-baking treatment can be performed, for example by heating the light emitting element 10 and the optical part 20 at a temperature of about 120° C. for about 2 hours in the oven.

(Setting Step of Element and Part for Film Forming)

Then, the setting step S104 of element and part for film forming is performed. Specifically, the light emitting element 10 and the optical part 20 are disposed into a reactor (not shown). The reactor has a first raw material gas supply line, a second raw material gas supply line, a nitrogen gas supply line, and a vacuum line, all of which (not shown) are connected to the reactor.

(Preparatory Step Before Film Forming)

Next, the preparatory step S105 before film forming is performed. Specifically, the interior state of the reactor in which the light emitting element 10 and the optical part 20 have been disposed is stabilized, for example by decompressing it to a lower pressure via a vacuum line equipped with a rotary pump. Upon such decompression, a nitrogen gas may be introduced into the reactor, thereby exhausting unnecessary materials (e.g., air) from the reactor.

The inside pressure of the reactor may be in the range of about 0.1 to 10 torr (133 to 13332 Pa), for example. The flow rate of nitrogen gas may be about 20 sccm ($33 \times 10^{-3}$ Pa·m³/s). In order to suitably stabilize the interior state of the reactor, it is preferable to maintain the above conditions for about 10 minutes.

For example, the inside temperature of the reactor may be about 100° C., for example. Although a predetermined temperature is generally maintained in the subsequent process of the film forming, such temperature for the film forming is not limited thereto. The temperature may be appropriately changed as needed.

The temperature during the film forming may be decided appropriately. It is preferably set in the range of about 50 to 500° C. in view of the heat resistances of the light emitting element 10 and optical part 20. For example in a case where the light emitting element 10 or the optical part 20 contains a nitride phosphor having a relatively low heat resistance (for example, CASN containing CaSiAlN$_3$:Eu as a basic composition, or SCASN containing Sr in a larger amount), the temperature during the film forming is preferably set in the range of 100 to 200° C.

(Supplying Step of First Raw Material Gas)

Next, the supplying step S106 of first raw material gas is performed. Specifically, the TMA is introduced into the reactor as the first raw material gas. The introduced TMA is in the form of vapor at a room temperature. After the introducing of the TMA, the reactor is kept for a predetermined time until the introduced TMA spreads across the entire bonding surface. The TMA in the form of vapor may be introduced into the reactor in a short time (e.g., for 0.001 to 1 seconds) with respect to a time required for the supplying step S106 of first raw material gas.

The time for the introduction of the first raw material gas can be determined according to a superficial area of the bonding surface, a volume of the device, and the supplied amount of the raw material gas per unit time. It is preferred that the reaction can take enough time after the introduction of the TMA.

(First Exhaust Step)

Next, the first exhaust step S107 is performed. Specifically, the excessive TMA which has not contributed to the reaction, and also the by-products are exhausted from the reactor. Such exhausting is performed not only by permitting a communication between the reactor and a vacuum line, but also by introducing a nitrogen gas into the reactor. The by-product in this step may be a methane gas, for example.

(Supplying Step of Second Raw Material Gas)

Next, the supplying step S108 of second raw material gas is performed. Specifically, the water (H$_2$O) is introduced into the reactor as the second raw material gas. The introduced water is in the form of vapor at a room temperature. After the introducing of the water, the reactor is kept for a predetermined time until the introduced water spreads across the entire bonding surface. The introduction of the water can be performed in the same way as that of the above-mentioned TMA.

The time for the introduction of the second raw material gas can be determined according to a superficial area of the bonding surface, a volume of the device, and the supplied amount of the raw material gas per unit time. It is preferred that the reaction can take enough time after the introduction of the water.

(Second Exhaust Step)

Next, the second exhaust step S109 is performed. Specifically, the excessive water which has not contributed to the reaction, and also the by-products are exhausted from the reactor. Such exhausting is performed not only by permitting a communication between the reactor and the vacuum line, but also by introducing a nitrogen gas into the reactor.

According to the preferred concrete embodiment as described above, the sequential processes from the supplying step S106 of first raw material gas to the second exhaust step S109 are regarded as a basic cycle for the film forming, and thus such basic cycle may be repeated a predetermined number of times. At a point in time after the end of the second exhaust step S109, it is determined as the step S110 whether or not the cycle has been repeated a predetermined number of times. In a case where the predetermined number of times is not completed (i.e., if "No" in the step S110), the operation returns to the supplying step S106 of first raw material gas so that the cycle is repeated. In contrast, when the predetermined number of times is completed (i.e., if "Yes" in the step S110), the forming step S14 of hydroxyl group comes to an end.

As described above, one basic cycle for the film forming according to the ALD makes it possible to laminate the Al$_2$O$_3$ film on the bonding surface in an unit of atomic layer. Thus, the thickness of the formed film can be suitably controlled according to the number of times of the basic cycle. As such, the formed film has a laminated structure in the unit of atomic layer, and thus it can be a more densified film with very few pin holes and a more uniform thickness.

According to the preferred concrete embodiment of the present invention, the formed film on the bonding surface has a uniformly distributed hydroxyl groups, which makes it possible to achieve a desired strength of the bonding characteristics in spite of no heating treatment performed in the boding step.

The bonding step S16 after the formation of the hydroxyl group can be performed under atmospheric conditions. Further, the bonding step S16 may be performed at a temperature lower than the processing temperature of the ALD, preferably at a room temperature, and thereby the bonding can be achieved without maintaining a high-temperature environment produced directly after the ALD process. Furthermore, the bonding can be achieved regardless of the materials of the light emitting element and the optical part due to the fact that the film surface formed by the ALD suitably serves as the actual bonding surface.

While the preferred concrete embodiment of the present invention has been hereinbefore described, it is only for illustrative purposes to explain the typical embodiment. The scope and spirit of the present invention are not limited to the description above, and have to be broadly construed based on the accompanied claims. It will be thus appreciated by those skilled in the art that various modifications are possible without departing from the scope and spirit of the present invention.

For example, the heat treatment after the step (ii) might be optionally possible if it causes no adverse effect on the light emitting element and the optical part. In this case, there might be achieved a stronger bonding.

While the above-mentioned embodiment specifies the film forming of the ALD in that two kinds of raw material gas are alternatively supplied onto the bonding surfaces, the present invention is not limited thereto. For example, while one raw material (e.g., oxygen) is constantly supplied, the film forming process can be controlled by alternately performing the supply of the other raw materials (e.g., TMA) and the plasma processing. In this case, the by-products or unreacted other raw materials may be exhausted (i.e., purged) at a point in time between the plasma processing and the supply of the other raw materials. The exhaust can be performed, for example by an introduction of a flow of an inactive gas (e.g., a flow of nitrogen or rare gas) into the reaction for the ALD, and/or by a vacuum aspiration.

Further, another kind of ALD process for film forming may be performed so as to form the hydroxyl groups on the bonding surface.

It should be noted that the present invention as described above includes the following aspects.

First Aspect:
A method for manufacturing a light emitting device comprising a light emitting element and an optical part, the method comprising the steps of:
(i) forming a hydroxyl film on a bonding surface of each of the light emitting element and the optical part by an atomic layer deposition; and
(ii) bonding the bonding surfaces of the light emitting element and the optical part with each other, each of the bonding surfaces having the hydroxyl film formed thereon,
wherein a substep is repeated at least one time in the step (i), in which substep a first raw material gas and a second raw material gas are sequentially supplied onto the bonding surfaces of the light emitting element and the optical part, and
wherein the bonding of the bonding surfaces in the step (ii) is performed without a heating treatment.

Second Aspect:
The method according to the first aspect, wherein the light emitting element and the optical part are cooled down to a room temperature at a point in time between the steps (i) and (ii).

Third Aspect:
The method according to the first or second aspect, wherein a room-temperature contact treatment is performed in the step (ii) wherein the bonding surfaces of the light emitting element and the optical part are brought into contact with each other under a room temperature condition, and thereby being bonded with each other.

Fourth Aspect:
The method according to any one of the first to third aspects, wherein a gas having a reactivity with respect to a hydroxyl group having been preliminarily introduced on the bonding surfaces is used as the first raw material gas, and a gas having a substitutional reactivity with respect to a functional group of the first raw material gas having reacted with the hydroxyl group of the bonding surfaces is used as the second raw material gas.

Fifth Aspect:
The method according to any one of the first to fourth aspects, wherein, prior to the atomic layer deposition of the step (i), at least one of the bonding surfaces of the light emitting element and the optical part is subjected to a plasma treatment, followed by being exposed to a water.

Sixth Aspect:
The method according to any one of the first to fifth aspects, wherein a film with its thickness of 1 to 5 nm is formed as the hydroxyl film in the step (i).

Seventh Aspect:
The method according to any one of the first to sixth aspects, wherein the optical part has a light permeability.

Eighth Aspect:
The method according to any one of the first to seventh aspects, wherein at least one selected from a group consisting of TMA (trimethylaluminium), TEOS (tetraethoxysilane), TDMAS (tris(dimethylamino)silane), TEMAH (tetrakis(ethylmethylamino)hafnium), TEMAZ (tetrakis(ethylmethylamino)zirconium) and TDMAT (tetrakis(dimethylamino)titanium) is used in a gaseous state as the first raw material gas.

Ninth Aspect:
The method according to any one of the first to eighth aspects, wherein at least one selected from a group consisting of water, hydrogen peroxide and ozone is used in a gaseous state as the second raw material gas.

Tenth Aspect:
The method according to the ninth aspect when appendant to the eighth aspect, wherein the TMA is used in the gaseous state as the first raw material gas, whereas the water is used in the gaseous state as the second raw material gas.

Eleventh Aspect:
The method according to any one of the first to tenth aspects, wherein at least one of the bonding surfaces of the light emitting element and the optical part is subjected to a planarizing treatment at a point in time before the step (i).

Twelfth Aspect:
The method according to the eleventh aspect, wherein the planarizing treatment is performed such that an arithmetic average roughness Ra regarding each of the bonding surfaces of the light emitting element and the optical part is 1 nm or less.

Thirteenth Aspect:

The method according to any one of the first to twelfth aspects, wherein the light emitting element comprises a light emitting layer and a sapphire substrate, and a surface of the sapphire substrate corresponds to the bonding surface of the light emitting element.

Fourteenth Aspect:

The method according to any one of the first to thirteenth aspects, wherein the optical part is a wavelength-conversion part for converting a light emitted from the light emitting element into a light having a different wavelength from that of the light emitting element.

EXAMPLES

A confirmatory test on the bonding characteristics associated with the manufacturing method of the present invention was conducted.

<Bonding Evaluation>

In this test, 3-inch sapphire wafer was used as an element corresponding to the light emitting element. Further, another sapphire wafer having the same size as that of the above was used as a part corresponding to the optical part. And also a sapphire lens having a diameter of 3 mm was further used as a part corresponding to the optical part. One cycle of the film forming process of the ALD was performed using the TMA and water as raw material gases, and thereby the hydroxyl groups were formed on the respective bonding surfaces of the sapphire wafers and lens. The temperature of the sapphire wafers and lens in the film forming process of the ALD was about 100° C. After the film forming process of the ALD, the sapphire wafers and lens were cooled down to a room temperature and then were bonded with each other. That is, the room-temperature contact treatment was performed to bond the sapphire wafers and lens with each other.

As a result, it was confirmed that the film forming process of the ALD had achieved a satisfactory bonding between the sapphire wafers and between the sapphire wafer and the sapphire lens.

<Manufacturing of Light Emitting Device>

In accordance with the manufacturing method of the present invention, the light emitting device with its structure as shown in FIG. 1B was fabricated.

In order to enlarge a light transmission layer in a face-down mounted-type LED chip (i.e., light emitting element 10) by increasing its thickness, a flat plate-shaped sapphire (i.e., optical part 20) was bonded to a substrate of the LED chip.

(Process 1)

A LED chip was provided. The LED chips were arranged over a jig substrate such that their sapphire substrates faced upward. The bonding surface regarding the LED chips was polished by the CMP process so that it had a surface roughness Ra of 1 nm or less.

(Process 2)

A flat plate made of sapphire was provided. The bonding surface regarding the flat plate was polished by the CMP process so that it had an arithmetic average roughness Ra of 1 nm or less.

(Process 3)

The LED chips and the flat plate were introduced into an ALD apparatus, and thereafter at least one cycle of film forming was performed.

(Process 4)

The LED chips and the flat plate were taken out of the ALD apparatus, followed by being left to be cooled down to a room temperature.

(Process 5)

The sapphire surface of each of the LED chips arranged on the jig substrate, and a bonding surface of the flat plate were opposed to each other, and then bonded with each other there under a condition of room temperature. Upon such bonding, they were brought into contact with each other under pressure by using of a press apparatus.

(Process 6)

The jig substrate was removed from the LED chips bonded to the flat plate made of sapphire.

(Process 7)

The LED chips bonded to the flat plate made of sapphire were divided such that they were cut between the arranged LED chips.

(Process 8)

The LED chip bonded to the flat plate was face-down mounted on a mounting substrate, and thereafter a resin molding was performed to seal the LED chip.

Throughout the above Processes 1 to 8, there was obtained the light emitting device in the form of package.

INDUSTRIAL APPLICABILITY

The present invention can be applied to any manufacturing methods of a light emitting device such as a high efficiency LED, a LED for emitting ultraviolet light, and the like. Such light emitting device can be suitably utilized, for example in an illumination equipment, a sterilizer, a head light for a vehicle, a display device, a device for light advertisement, or the like.

What is claimed is:

1. A method for manufacturing a light emitting device comprising a light emitting element and an optical part, the method comprising the steps of:
   (i) forming a hydroxyl film on a bonding surface of each of the light emitting element and the optical part by an atomic layer deposition; and
   (ii) bonding the bonding surfaces of the light emitting element and the optical part with each other, each of the bonding surfaces having the hydroxyl film formed thereon,
   wherein a substep is repeated at least one time in the step (i), in which substep a first raw material gas and a second raw material gas are sequentially supplied onto the bonding surfaces of the light emitting element and the optical part, and
   wherein the bonding of the bonding surfaces in the step (ii) is performed without a heating treatment.

2. The method according to claim 1, wherein the light emitting element and the optical part are cooled down to a room temperature at a point in time between the steps (i) and (ii).

3. The method according to claim 1, wherein a room-temperature contact treatment is performed in the step (ii) wherein the bonding surfaces of the light emitting element and the optical part are brought into contact with each other under a room temperature condition, and thereby being bonded with each other.

4. The method according to claim 1, wherein a gas having a reactivity with respect to a hydroxyl group having been preliminarily introduced on the bonding surfaces is used as the first raw material gas, and
   a gas having a substitutional reactivity with respect to a functional group of the first raw material gas having reacted with the hydroxyl group of the bonding surfaces is used as the second raw material gas.

5. The method according to claim 1, wherein, prior to the atomic layer deposition of the step (i), at least one of the bonding surfaces of the light emitting element and the optical part is subjected to a plasma treatment, followed by being exposed to a water.

6. The method according to claim 1, wherein a film with its thickness of 1 to 5 nm is formed as the hydroxyl film in the step (i).

7. The method according to claim 1, wherein the optical part has a light permeability.

8. The method according to claim 1, wherein at least one selected from a group consisting of TMA (trimethylaluminium), TEOS (tetraethoxysilane), TDMAS (tris(dimethylamino)silane), TEMAH (tetrakis(ethylmethylamino)hafnium), TEMAZ (tetrakis(ethylmethylamino)zirconium) and TDMAT (tetrakis(dimethylamino)titanium) is used in a gaseous state as the first raw material gas.

9. The method according to claim 1, wherein at least one selected from a group consisting of water, hydrogen peroxide and ozone is used in a gaseous state as the second raw material gas.

10. The method according to claim 1, wherein a TMA (trimethylaluminium) is used in the gaseous state as the first raw material gas, whereas a water is used in the gaseous state as the second raw material gas.

11. The method according to claim 1, wherein at least one of the bonding surfaces of the light emitting element and the optical part is subjected to a planarizing treatment at a point in time before the step (i).

12. The method according to claim 11, wherein the planarizing treatment is performed such that an arithmetic average roughness Ra regarding each of the bonding surfaces of the light emitting element and the optical part is 1 nm or less.

13. The method according to claim 1, wherein the light emitting element comprises a light emitting layer and a sapphire substrate, and a surface of the sapphire substrate corresponds to the bonding surface of the light emitting element.

14. The method according to claim 1, wherein the optical part is a wavelength-conversion part for converting a light emitted from the light emitting element into a light having a different wavelength from that of the light emitting element.

* * * * *